United States Patent [19]

Fukuta

[11] 4,015,278

[45] Mar. 29, 1977

[54] FIELD EFFECT SEMICONDUCTOR DEVICE

[75] Inventor: Masumi Fukuta, Kobe, Japan

[73] Assignee: Fujitsu Ltd., Kawasaki, Japan

[22] Filed: May 13, 1976

[21] Appl. No.: 686,250

Related U.S. Application Data

[63] Continuation of Ser. No. 527,208, Nov. 26, 1974, abandoned, which is a continuation of Ser. No. 318,629, Dec. 26, 1972, abandoned.

[52] U.S. Cl. ................................. 357/22; 357/41; 357/45; 357/46; 357/55; 357/68
[51] Int. Cl.² ................. H01L 29/80; H01L 27/02; H01L 27/10; H01L 29/06
[58] Field of Search .............. 357/22, 41, 45, 46, 357/55, 68

[56] References Cited

UNITED STATES PATENTS

| | | | |
|---|---|---|---|
| 3,681,220 | 8/1972 | Chizinsky | 357/22 |
| 3,764,865 | 10/1973 | Napoli et al. | 357/22 |
| 3,783,349 | 1/1974 | Beasom | 357/22 |

*Primary Examiner*—Edward J. Wojciechowicz
*Attorney, Agent, or Firm*—Staas & Halsey

[57] ABSTRACT

A high power field effect semiconductor device in which the gate length per given area of a semiconductor substrate is great and a channel is formed to extend from the main surface of the semiconductor substrate toward the other main surface to make current density as uniform as possible to thereby provide a high output power and which has a construction to allow ease in the attachment of electrodes.

14 Claims, 8 Drawing Figures

FIELD EFFECT SEMICONDUCTOR DEVICE

This is a continuation of application Ser. No. 572,208, filed Nov. 26, 1974, now abandoned, in turn a continuation of application Ser. No. 318,629 filed Dec. 26, 1972, now abandoned.

BACKGROUND OF THE INVENTION

1. Field of the Invention

This invention relates to a field effect semiconductor device, and more particularly to a field effect semiconductor device in which the gate length per given area of a semiconductor substrate is great to provide a large output and which is adapted to provide an excellent frequency characteristic.

2. Description of the Prior Art

Field effect transistors (hereinafter referred to as FET's for the sake of brevity) are far higher in input impedance than bipolar transistors, and hence they have advantages such as requiring small driving power therefor and exhibiting low noise, even in the case of a signal source impedance being high. However, the typical FET's have an extremely small capability of handling high electric power, as compared with the bipolar transistors. One of the reasons therefor lies in the electrode structure employed in the FET's. Two solutions are considered possible therefor: One is to increase the gate length per one unit such as a source or drain electrode and the other is to increase the degree of integration of units on a given semiconductor substrate and actuate the units in parallel, thereby to obtain a large output as a whole.

These two solutions are contradictory to each other but, eventually, it is necessary to maximize the opposing length between pluralities of source and drain regions formed on a semiconductor substrate, increase the area occupied by each of the source and drain region, and cause a uniform operation over the entire area of the semiconductor substrate. Further, it is also necessary to prevent local overheating due to nonuniformity of current density caused by local nonuniformity in impurity concentration and in diffusion depth in each of the source and drain regions.

SUMMARY OF THE INVENTION

One object of this invention is to provide a FET employing an electrode structure for obtaining high output power.

In accordance with this and other objects of this invention, there is provided an FET having a pattern construction that the opposing length between source and drain regions, that is, the gate length, per unit area of a semiconductor substrate is great. Further, the FET has an increased overall gate length and the areas of sites of source and drain regions for the attachment of electrodes therefor are increased, thereby to obtain a large output. Further, the FET is adapted to prevent occurrence of local overheating which results from nonuniformity in current density when the FET is operated with a high power.

BRIEF DESCRIPTION OF THE DRAWINGS

These and other objects and advantages of the present invention will become more apparent by referring to the following detailed description and accompanying drawings, in which.

DESCRIPTION OF THE PREFERRED EMBODIMENTS

Figure 1:
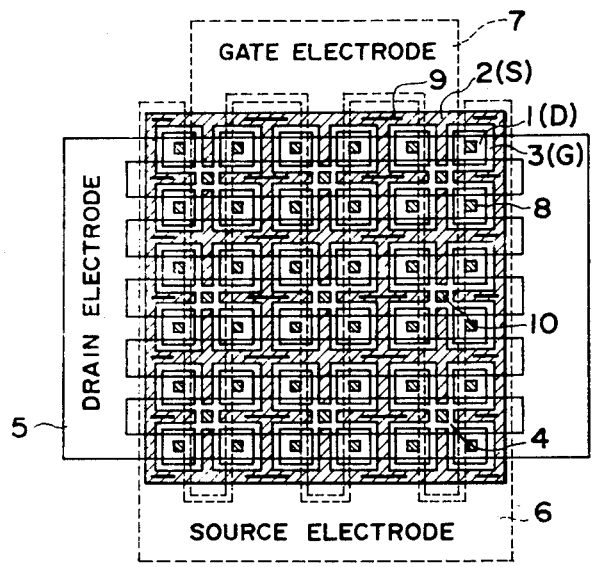
FIG. 1 is a schematic diagram showing one example of a plane pattern of a field effect semiconductor device of this invention.

In FIG. 1, reference numeral 1 indicates polygonal (square in the figure) source or drain regions, for example, drain region 2 a source or drain region, for example, a source region formed to extend along each side of drain regions 1 in a manner tending to surround them, 3 gate regions, each disposed to isolate the drain and source regions from each other; 4 cutoff or common regions of the source regions 2; 5 a drain electrode; 6 a source electrode; 7 a gate electrode; 8 connection points between the drain regions 1 and the drain electrode; 9 connection points between the source regions 2 and the source electrode 6; and 10 connection points between the gate regions 3 and the gate electrode 7 in the cutoff regions 4.

The square drain regions 1 are closely disposed adjacent to one another in a plane and the source region 2 is arranged to extend along each side of the drain regions 1 substantially to encompass them. The source region 2 is formed in such a mesh-like configuration that it is cut off at least at one corner of each rain region 1. The gate regions 3 are each formed along each side of each drain region 1 to enclose and isolate it from neighboring source region 2 by the same width. By impressing a voltage to the gate region 3, conductivity of a channel formed between the drain region 1 and the source region 2 controlled as is the case with usual FET's.

The four gate regions 3 located about each cutoff region 4 formed by cutting off the source region 2 are electrically interconnected through the cutoff region 4 and connected to the gate electrode 7 at each connection point 10. The drain electrode 5 is shown to be formed in the shape of a ladder having formed therein a plurality of rectangular windows and rows of the drain electrode 5 being connected thereto at the plurality of connection points 8. The source and gate electrodes 6 and 7 each are shown to be formed in a comb-like configuration and are arranged so that their teeth intermesh with, but remain spaced from each other and these electrodes 6 and 7 are connected to columns of each of the connection points 9 and 10.

With the use of the plan pattern shown in FIG. 1, it is possible that the drain regions 1 are each surrounded by the mesh-like source region 2 having cutoff regions 4 while being closely arranged on a plane, thus providing for extremely increased gate length per unit area of the semiconductor substrate. It thus will be seen that the common drain, source, and gate electrodes 5, 6 and 7 in FIG. 1 lie in a different plane than the respectively associated electrodes 1(D), 2(S), and 3(G) and are provided to connect the latter to corresponding external electrodes, such as stem leads, in common.

FIGS. 2A to 2D illustrate sectional constructions of various embodiments of the semiconductor device produced according to this invention. Let it be assumed that each substrate is made of gallium arsenide. In the figures, reference numerals 1, 2 and 3 designate the same elements as those in FIG. 1, 12 drain regions, 13 source regions, 14-epitaxial layers, 15 gold-germanium alloy layers, 16 and 16' aluminum vapor deposited layers, and 17 a low resistivity semiconductor layer having vertical extension.

Figure 2A:
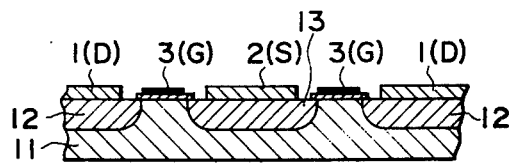
FIGS. 2A to 2D, inclusive, show sectional constructions of various examples of this invention.
Figure 2B:
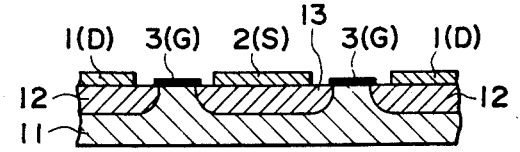
Figure 2C:
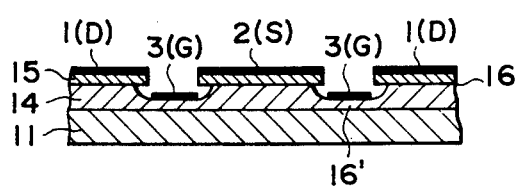
Figure 2D:
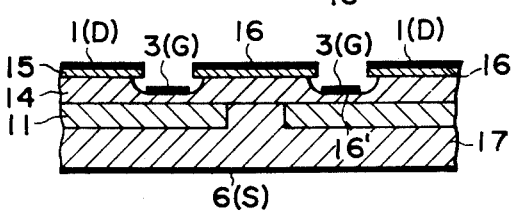

FIGS. 2A and 2B show the sectional constructions of an insulated gate and a Schottky gate semiconductor device respectively, and FIGS. 2C and 2D those of semiconductor devices produced by the same manufacturing method as that for a self aligned gate FET. Since the semiconductor devices depicted in FIGS. 2A and 2B are well-known in the art, no description will be given of them but those of FIGS. 2C and 2D will be described in an order of steps involved in the manufacture of them. The manufacture starts with the formation of an N-type gallium arsenide epitaxial layer 14 having a thickness of $2\mu$ and an impurity concentration of $5\times10^{15}$ to $10^{17}$ atoms/cm$^3$, on the substrate 11. Then a pattern such as shown in FIG. 1 is formed on the epitaxial layer 14. Namely, the gold-germanium alloy layers 15 are vapor deposited on the drain and source regions 1 and 2, and the N-type gallium arsenide epitaxial layer 14 is etched away to a depth of about $1\mu$ through the gold-germanium alloy layers 15 serving as an etching mask. Next, aluminum is vapor deposited about 2000A over the entire area of the assembly to form the aluminum vapor deposited layers 16 and 16'.

At this time, Schottky barriers are formed between the gallium arsenide and the aluminum in the regions 3 intermediate the vapor deposited layers 16 and 16', so that the aluminum deposited at that area is used as a gate region. In the drain and source regions 1 and 2, the gallium arsenide in the epitaxial layer 14 and the gold-germanium alloy layer 15 form excellent ohmic contacts due to alloying reaction. Thereafter, a silicon dioxide film resulting from thermal decomposition of monosilane is formed all over the aluminum vapor deposited layers 16 and 16'. Then, the silicon dioxide film is selectively removed to form therein windows for drain electrodes at those areas corresponding to the connection points 8 shown in FIG. 1, through which windows the drain electrodes 5 are vapor deposited. Next, a silicon dioxide film is formed again over the entire area of the assembly and it is selectively removed to form therein windows for source and gate electrodes at the connection points 9 and 10 as shown in FIG. 1 respectively. Then the source and gate electrodes 6 and 7 are vapor deposited through the windows respectively.

In the example of FIG. 2D, the source electrode 6 is formed on the underside of the substrate 11.

With any of these sectional constructions, conductivity a chanel between the drain and source regions 1 and 2 is controlled by a voltage impressed to the gate electrode 3 as is the case with conventional FET's.

Figure 3:
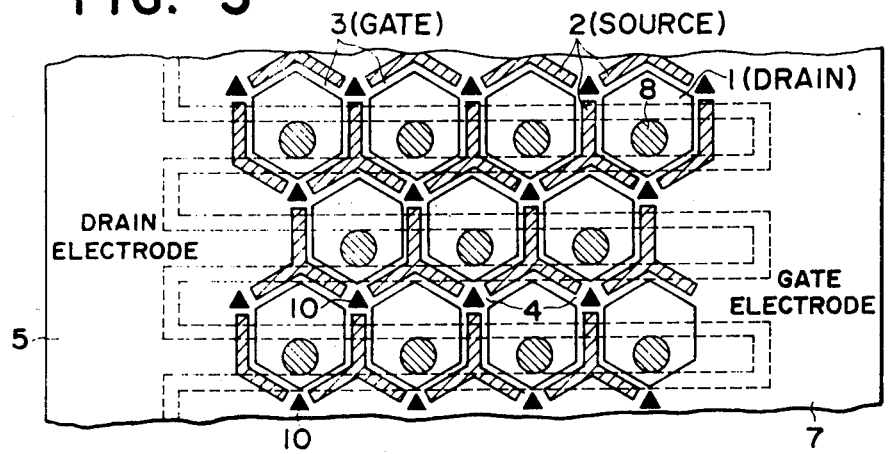
FIG. 3 is a schematic diagram illustrating another example of the plan pattern of the field effect semiconductor device of this invention.

FIG. 3 shows one example of the pattern in which either source or drain region (the drain region in the illustrated example) is formed in a regular hexagonal configuration. In the figure, reference numerals correspond to those in FIG. 1.

Along respective sides of the hexagonal drain regions 1, the source region 2 is disposed in a mesh-like form to encompass substantially each drain region 1 and the mesh of source regions 2 are severed by the cutoff regions 4 into individual ones. The gate regions 3 are formed to isolate the drain and source regions from each other as in the example of FIG. 1 and they are electrically interconnected at the cutoff regions 4. In the illustrated example, the drain and gate electrodes 5 and 7 are shaped comb-like and are arranged with their teeth intermeshing with, but spaced from each other. The drain and gate electrodes 5 and 7 are connected with the drain and gate regions 1 and 3 at the drain and gate connecting points 8 and 10 respectively, while the source regions 2 are connected with the source electrode (not shown) disposed on the underside of the substrate.

As described above, with the electrode patterns of this invention shown in FIGS. 1 and 3, either drain or source regions (drain regions 1 in the illustrated examples) are closely arranged on the plane, that is, disposed with the respective sides of each polygonal region being opposed to those of adjacent polygonal regions at the same distance and the other regions (the source regions 2 in the figures) are arranged in a mesh-like form to extend along the respective sides of the polygonal regions. The mesh of the other regions is severed at least at one corner of each polygonal regions and the gate regions 3 positioned surrounding each drain region 1 are electrically interconnected through the cut-off region 4. Therefore, the gate length per unit area of the substrate is signficantly increased, as compared with those obtainable with conventional pattern constructions. For example, a gate length of 1cm can be obtained with as small a substrate as 0.4m/m. Where the substrate is made of gallium arsenide, it is possible to produce a high microwave output power FET having an output power of 10W and a power gain of about 5db, for example, at 4GHz.

Needless to say, the gate may be any of various types as shown in FIG. 2 and the semiconductor substrate may be formed of indium antimonide, indium arsenide, germanium, silicon or the like other than gallium arsenide.

The polygonal regions 1 may be either source or drain regions and they are shown in regular square and hexagonal forms in the foregoing examples but, it is apparent that they may be in a regular triangular form or in any other desired polygonal configuration so long as they can be closely arranged on the plane. Further, it is also possible to employ a combination of different polygonal shapes, for example, pentagonal and triangular forms, so long as the regions can be connected to their electrodes.

Figure 4:
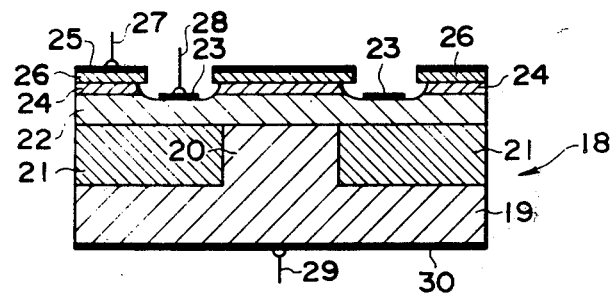
FIG. 4 schematically shows an example of the field effect semiconductor device of this invention which has a construction that a channel is formed to have a portion extending from the one main surface of a semiconductor substrate toward the other main surface thereof.

FIG. 4 illustrates in section a semiconductor device of the construction corresponding to that of FIG. 2D, in which either source or drain electrode is disposed on the one main surface of the semiconductor substrate and the other electrode is disposed on the other main surface of the substrate. With such a construction, a channel is formed to have a portion extending from the one main surface of the semiconductor substrate towards the other main surface thereof to provide room for the arrangement of the source and drain electrodes on the semiconductor substrate. Coupled with this, the areas of the source and drain electrodes for each FET are increased to cope with a large output. FIG. 4 is one example of this invention, showing the construction of a FET having a Schottky barrier type gate electrode on the surface of a substrate made of gallium arsenide.

In FIG. 4, the substrate 18 is made of gallium arsenide, and a layer close to its underside is an N-type source region 19 and a vertical portion 20 of a channel is formed contiguous to the source region 19. The vertical portion 20 is homogeneous with the source region 19 and surrounded by a gallium arsenide isolation layer 21 (hereinafter referred to as an isolation layer) having a very high resistivity (of, for example, about $10^8 \Omega cm$) extremely close to that of an insulating material. The gallium arsenide having such a high resistivity can be obtained by adding a small amount of chromium to gallium arsenide, as is well-known.

Even in the isolation layer 21 is formed of a true insulating material such, for example, as ceramic, glass or the like, the operational priniciple of the FET remains unchanged but the use of such a remarkely high resistivity gallium arsenide facilitates the manufacture of the device.

The upper part of the vertical portion 20 of the channel is contiguous to an N-type gallium arsenide layer 22 of high resistivity. This portion corresponds to an extension of the channel, but in the present example, a Schottky barrier is formed under each gate electrode 23, so that the resistivity of the portion 22 is raised so as to allow ease in the formation of the Schottky barrier. The thickness of the high resistivity N-type layer 22 is sufficient to be less than several microns.

Further, gate electrodes 23 are deposited on the surface of the high resistivity N-type layer 22 and a drain electrode 25 is mounted through a low resistivity N-type layer (an N$^+$-type layer) 24. In FIG. 4, an alloy layer 26 composed mainly of gold is deposited immediately below the drain electrode 25 and the reason for the provision of the gold alloy layer 26 will be described later in connection with the manufacturing process.

For the fabrication of the FET of such a construction as depicted in FIG. 4, it is convenient to start with the gallium arsenide substrate a small amount of chromium and having an extremely high resistivity. Grooves reformed in one surface of the substrate 18 and an N-type layer is formed by the epitaxial growth method on that surface, which N-type layer is used as the source region 19 and the channel 20. The high resistivity N-type layer 22 and also the N$^+$-type layer 24 are formed by the epitaxial growth method. In this case, either the gas phase growth method or the liquid phase growth method or the liquid phase growth method can be employed.

It is desirable to employ the self alignment method for the deposition of the gate electrodes 23. Namely, grooves extending down to the high resistivity N-type layer 22 are formed by photoetching with the gold alloyed layer 26 on the N$^+$-type layer 24 being used as an etching mask and then aluminium is deposited by means of evaporation or the like in the grooves from the side of the surface of the substrate, by which a Schottky barrier is readily formed between the aluminum layer 23 deposited on the N$^+$-type layer 22 and the N-type gallium arsenide layer 20 immediately below the layer 23. The aluminum layer deposited on the gold alloyed layer 26 can be utilized as the drain electrode 25. By the way, eaves-like projections of the gold alloyed layer 26 extending above the depressions result from side etching.

The gate and drain electrodes, which appear as if they are respectively divided into two, are coupled at one end to each other and electrically parallel with each other in practice. Therefore, leads for external connection are respectively shown to be one as indicated by 27 and 28. By connecting a DC power source between the leads 27 and 29 of the drain and source, a channel current flows from the drain electrode 25 through the portion immediately below the gate electrode 23 and the vertical portion 20 of the channel to the source electrode 30. Accordingly, by impressing a DC bias voltage and a signal voltage to the gate electrode 23 through the lead 28, the channel current can be controlled by a gate voltage as in a conventional FET. Even if the gate electrode and the channel are spaced apart from each other by an insulating material layer, the same results can be naturally obtained but, for the application of the construction of the semiconductor device of this invention to a junction FET, it is sufficient to form a diffused layer of opposite conductivity type to the channel immediately below the gate electrode 23 and attach the gate electrode 23 with the diffused layer, that is the gate region, in a non-rectifying manner.

Figure 5:
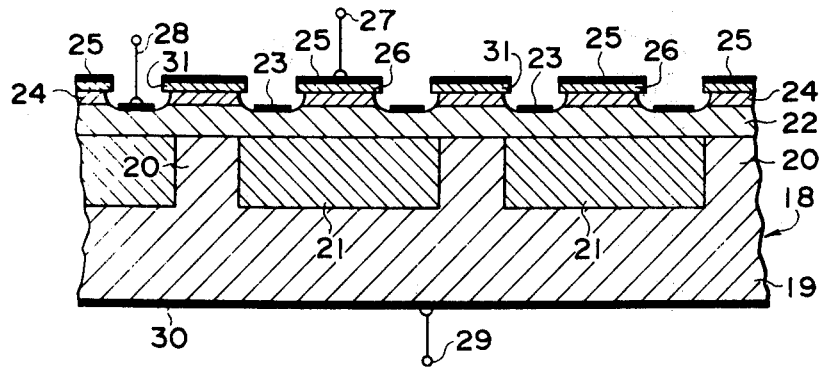
FIG. 5 schematically shows an example of the field effect semiconductor device of this invention in which a plurality of the elementary semiconductor elements depicted in FIG. 4 are incorporated.

The FET structure in FIG. 4 shows a single FET and is used as one unit. By forming many units on one substrate and connecting the units in parallel to form them as one element as a whole, it is possible to increase allowable power dissipation and mutual conductance in accordance with the number of units connected in parallel. FIG. 5 illustrates the construction of one example of a high power FET thus constructed and parts corresponding to those in FIG. 4 are identified by the same reference numerals. In the example of FIG. 5, however, the source region 19 and the source electrode 30 are formed in common to all of the units. No particular difficulty is involved in the manufacture of the element of FIG. 5, as compared with the case of the fundamental construction of FIG. 4. Further, the construction of FIG. 5 also allows ease in the manufacture of an insulated gate or PN junction element.

It is also possible that the electrode 30, with terminal 29, formed on the underside of the substrate 18 is used as the drain electrode. In such a case, the electrode 25, with terminal 27, is used as the source electrode deposited through the gold alloy layer 26 (the layer 31 deposited on the top of the vertical portion of the channel not being employed in either instance).

As will be seen from the foregoing, in the FET of this invention, one of the three electrodes is mounted on the one main surface of the substrate different from the other main surface on which the remaining two electrodes are formed, so that if the two electrodes (the drain and gate electrodes in the example of FIG. 1) lying on the same main surface are shaped comb-like as shown in FIG. 1, the area of the substrate can effectively used as is the case with a bipolar transistor of high frequency and high power. Therefore, the construction of this invention is of particular utility when employed in FET's of high power. In addition, since the vertical portion 20 of the channel provides a series resistance for the source, the series resistance acts to make currents of respective units uniform and stabilize them in the case of an operation with high power. Even if the aforesaid portion 20 of the channel is inclined at a certain angle to the surface of the substrate, the action of providing the series resistance does not essentially change. Further, even if the one electrode is attached to the side of the substrate, the effects of this invention can be obtained.

The action of providing the series resistance by the vertical portion 20 of the channel plays an extremely important role in obtaining the high power semiconductor field effect device.

Namely, increasing the areas of the drain and source regions for each unit so as to provide a high output power the current density distribution during operation is rendered non-uniform due to local difference in the impurity concentration and non-uniformity in the diffusion depth within the same region. Once the non-uniformity has been caused, local overheating occurs in the drain region or in its vicinity, which finally leads to breakdown of the device.

To avoid this in the present invention, the aforesaid vertical portion 20 of the channel is positively utilized as a resistance element and the current density is made uniform all over the semiconductor substrate by the negative feedback action exhibited by the vertical portion 20, that is, the resistance element.

In the foregoing examples, the drain electrode and the source electrode are provided on different main surfaces of the substrate and the vertical portion 20 of the channel is utilized as a resistance element and the resistance element is embedded in the substrate. However, in some cases, all the electrodes may also be provided on the same main surface of the substrate together with the resistance element as depicted in FIGS. 2A to 2C. In this case, a diffused layer or a pinch resistor may be used as the resistance element and it is also possible to cover the surface of the substrate with an insulating film and deposite a thin film resistor on the insulating film. One end of the resistance element thus formed is connected electrically in parallel to an external terminal, for example a stem lead directly or through a conductive layer for parallel connection.

Namely, since the resistance is interposed between the source or drain region and the external terminal, even where the respective units are connected in parallel with one another for the operation with high power, breakdown resulting from non-uniformity of the current density is prevented. In particular, where the resistance element is connected with the source region, the negative feedback effect is increased to provide for sufficiently stabilized operation of the device. At this time, the mutual conductance of the gate is apparently decreased but, in practice, the mutual conductance of the gate is increased by forming many unit elements essentially isolated from one another on the same surface of the substrate and connecting them in parallel, so that no practical inconvenience is caused. Further, since the source series resistance acts to decrease the input capacitance equivalently, it is possible to increase allowable power dissipations by the parallel connection of the plurality of elements without decreasing the product of the gain and the bandwidth.

As has been described in the foregoing, the present invention employs such a pattern construction that the opposing length between the source and drain regions, that is, the gate length is increased so as to adapt the field effect semiconductor device for use with high power and the formation of the source and drain electrode pattern for each unit is easy. Therefore, it is possible to increase the entire output power of the semiconductor device per unit area of the semiconductor substrate. Further, with the construction of interposing the resistance element in series between the source of drain region and the external terminal, it is possible to avoid local overheating due to local non-uniformity of the semiconductor substrate during operation.

Numerous changes may be made in the above described device and the different embodiments of the invention may be made without departing from the spirit thereof; therefore, it is intended that all matter contained in the foregoing description and in the accompanying drawings shall be interpreted as illustrative and not in a limiting sense.

I claim as my invention:

1. A field effect semiconductor device having source and drain regions and a gate region, comprising:
   a semiconductor substrate of high resistivity material, the resistivity thereof substantially being that of an insulator, and having first and second opposite main surfaces,
   a layer of semiconductor material of a given conductivity type disposed on said first main surface,
   said layer of semiconductor material being formed to include a reduced thickness portion of a desired polygonal configuration defining said gate region and said gate region surrounding and thereby defining a portion of said first layer of corresponding polygonal configuration comprising a first region of said semiconductor layer, and the remaining portion of said layer surrounding said polygonal gate region comprising a second region of said semiconductor layer,
   said gate region thereby being elongated and surrounding and isolating said first region from said second region and defining a conducting path extending parallel to said first main surface of said substrate between said first and second regions of said semiconductor layer,
   first and second electrodes in ohmic contact with said first and second regions and a gate electrode in rectifying contact with said gate region, and
   means for applying voltages to said first and second electrodes to selectively operate one of said first and second regions as the source and the other thereof as the drain of said transistor and to said gate electrode to control the conductivity of the current channel between said source and drain regions.

2. A field effect semiconductor transistor as recited in claim 1 wherein said first region comprises said source and said second region comprises said drain.

3. A field effect semiconductor transistor as recited in claim 1 wherein said first region comprises said drain and said second region comprises said source.

4. A field effect semiconductor device having source and drain regions and a gate region, comprising:
   a semiconductor substrate of high resistivity material, the resistivity thereof substantially being that of an insulator, having first and second opposite main surfaces and having an opening extending transversely therethrough from said first main surface to said second main surface thereof,
   a first layer of semiconductor material of a given conductivity type disposed on said first main surface of said substrate and a second layer of semiconductor material of said given conductivity type disposed on said second main surface of said substrate and including a portion extending through said transverse opening to engage said first layer and electrically couple said second layer to said first layer, said transversely extending portion of said second layer comprising a transverse current channel, said first layer of semiconductor material being formed to include a reduced thickness portion of a desired polygonal configuration defining said gate region and said gate region surrounding and thereby defining a portion of said first layer of corresponding polygonal configuration comprising a first region of said first semiconductor layer, and the remaining portion of said layer surrounding said polygonal gate region comprising a second region of said first semiconductor layer, said gate region thereby being elongated and surrounding and isolating said first region from said second region and defining a conducting path extending parallel to said first main surface of said substrate between said first and second regions of said layer of semiconductor material, said substrate electrically insulating said first region and said gate region from said second semiconductor layer, and said second region of said first semiconductor layer extending over said opening in said substrate and in contact with said transversely extending portion of said second layer, a first electrode in ohmic contact with said second region of said first semiconductor layer, a gate electrode in rectifying contact with said gate region of said first semiconductor layer, and a second electrode in ohmic contact with said second semiconductor layer, and means for applying voltages to said first and second electrodes to selectively operate one of said second region of said first layer and said second layer, as the source, and the other thereof, as the drain, of said transistor, and to said gate electrode to control the conductivity of the parallel current channel between said source and drain regions.

5. A semiconductor device as recited in claim 4 wherein said second region of said first semiconductor layer comprises a source and said second semiconductor layer comprises said drain of said transistor.

6. A field effect semiconductor transistor as recited in claim 4 wherein said second region of said first semiconductor layer comprises a drain and said second semiconductor layer comprises said source of said transistor.

7. A field effect semiconductor transistor as recited in claim 4 wherein said opening in said substrate and correspondingly said portion of said second layer of semiconductor material extending therethrough is relatively narrow in a dimension parallel to said main surfaces of said substrate and elongated in the dimension thereof transverse to said main surfaces of said substrate whereby said transverse current channel presents an effective electrical resistance in series circuit between said source and drain of said transistor.

8. A composite semiconductor assembly including a plurality of field effect semiconductor devices connected for parallel operation and each having source, drain, and gate regions, comprising:

a semiconductor substrate of high resistivity material, the resistivity thereof substantialy being that of an insulator, and having first and second opposite main surfaces, a layer of semiconductor material of a given conductivity type disposed on said first main surface, said layer of semiconductor material being formed to include a plurality of reduced thickness portions each of a desired, common polygonal configuration defining said gate regions of said plurality of said plurality of devices, each said gate region surrounding and thereby defining an associated portion of said first layer of corresponding polygonal configuration comprising a first region of said first semiconductor layer, said plurality of gate regions and the respectively associated first regions surrounded thereby being disposed in closely adjacent relation in said first semiconductor layer with respective sides of adjacent ones of said plural polygonal gate regions in spaced, parallel relation and defining therebetween remaining portions of said first layer, said remaining portions of said first layer surrounding said polygonal gate regions comprising second regions of said semiconductor layer, said gate regions thereby each being elongated and surrounding and isolating the respectively associated said first regions from said surrounding second regions of said semiconductor layer and defining a conducting path extending parallel to said first main surface of said substrate between said associated first and said surrounding, second regions of said semiconductor layer, said second regions of said semiconductor layer thereby being common to adjacent ones of said plurality of gate regions and extending therebetween in a mesh-like configuration with portions of said second regions at locations common to related groups of adjacent, plural gate regions being removed to provide a reduced thickness of said semiconductor layer in said common locations for providing an interconnection area common to said gate regions of said related group of adjacent, plural gate regions, for each such related group thereof, a common gate electrode in rectifying contact with said plurality of gate regions at said common interconnection areas thereof, a first electrode in common ohmic contact with said plural first regions of said semiconductor layer and a second electrode in common ohmic contact with said plural second regions of said semiconductor layer, and means for applying voltages to said first and second electrodes to selectively operate one of said first and second regions as the source and the other thereof as the drain of said transistor, and to said common gate electrode to control the conductivity, in common, of the parallel current channels defined by said plural gate regions between respectively associated source and drain regions, thereby to operate said plurality of field effect semiconductor devices defined by said respectively associated gate, source, and drain regions, in parallel.

9. A composite semiconductor assembly as recited in claim 8 wherein said first regions comprise the sources and the associated second regions comprise the drains of the respective, plural field effect semiconductor devices.

10. A composite semiconductor assembly as recited in claim 8 wherein aid first regions comprise the drains and the associated second regions comprise the sources of the respective, plural field effect semiconductor devices.

11. A composite semiconductor assembly including a plurality of field effect semiconductor devices connected for parallel operation and each having source, drain, and gate regions, comprising:

a semiconductor substrate of high resistivity material, the resistivity thereof substantially being that of an insulator, having first and second opposite main surfaces and having plural openings extending transversely therethrough from said first main surface to said second main surface thereof, a first layer of semiconductor material of a given conductivity type disposed on said first main surface of said substrate and a second layer of semiconductor material of said given conductivity type disposed on said second main surface of said substrate and including plural portions thereof extending through said plural transverse openings to engage said first layer and electrically couple said second layer to said first layer, said transversely extending portions of said second layer comprising transverse current channels, said first layer of semiconductor material being formed to include a plurality of reduced thickness portions each of a desired, common polygonal configuration defining said gate regions of said plurality of devices, each said gate region surrounding and thereby defining an associated portion of said first layer of corresponding polygonal configuration comprising an associated first region of said first semiconductor layer, said plurality of gate regions and the respectively associated first regions surrounded thereby being disposed in closely adjacent relation in said first semiconductor layer with respective sides of adjacent ones of said plural polygonal gate regions in spaced parallel relation and defining therebetween remaining portions of said first layer, said remaining portions of said first layer surrounding said polygonal gate regions comprising second regions of said first semiconductor layer, said gate regions thereby each being elongated and surrounding and isolating the respectively associated said first regions from aid surrounding second regions of said first semiconductor layer and defining a conducting path extending parallel to said first main surface of said substrate between said associated first and said surrounding, second regions of said first semiconductor layer, said second regions of said semiconductor layer thereby being common to adjacent ones of said plurality of gate regions and extending therebetween in a mesh-like configuration with portions of said second regions at locations common to related groups of adjacent, plural gate regions being removed to provide a reduced thickness of said semiconductor layer in said common locations for providing an interconnection area common to said gate regions of said related group of adjacent, plural gate regions, for each such related group thereof, a common gate electrode in rectifying contact with said lurality of gate regions at said common interconnection areas thereof, a first electrode in common ohmic contact with said plural first regions of said semiconductor layer and a second electrode in ohmic contact with said second semiconductor layer, and means for applying voltages to said first and second electrodes to selectively operate one of said second regions of said first layer and said second layer, as the source, and the other thereof, as the drain, of each of said transistors, and to said common gate electrode to control the conductivity, in common, of the parallel current channels defined by said plural gate regions between said respectively associated source and drain regions, thereby to operate said plurality of field effect semiconductor devices defined by said respectively associated gate, source, and drain regions, in parallel.

12. A composite semiconductor assembly as recited in claim 8 wherein said second regions of said first semiconductor layer comprise the sources and said second semiconductor layer comprises a common drain of the respective, plural field effect semiconductor devices.

13. A composite semiconductor assembly as recited in claim 8 wherein said second regions of said first semiconductor layer comprise said drains and said second semiconductor layer comprises a common source of the respective, plural field effect semiconductor devices.

14. A composite semiconductor assembly as recited in claim 11 wherein each of said plurality of openings in said substrate and correspondingly said corresponding portions of said second layer of semiconductor material extending therethrough is relatively narrow in a dimension parallel to said main surface of said substrate and elongated in the dimension thereof transverse to said main surfaces of said substrate, whereby each said transverse current channel presents an effective electrical resistance in series circuit between said source and drain of each said transistor.

* * * * *

UNITED STATES PATENT AND TRADEMARK OFFICE
CERTIFICATE OF CORRECTION

PATENT NO. : 4,015,278
DATED : March 29, 1977
INVENTOR(S) : MASUMI FUKUTA

It is certified that error appears in the above-identified patent and that said Letters Patent are hereby corrected as shown below:

Column 6, line 58, after "can" insert -- be --.
Column 11, line 41, "aid" should be -- said --.
Column 12, line 10, "lurality" should be -- plurality --.

Signed and Sealed this fifth Day of July 1977

[SEAL]

Attest:

RUTH C. MASON
*Attesting Officer*

C. MARSHALL DANN
*Commissioner of Patents and Trademarks*